United States Patent
Ott, III et al.

(10) Patent No.: US 11,128,298 B2
(45) Date of Patent: Sep. 21, 2021

(54) ADVANCED CAPACITIVE PROXIMITY SENSOR

(71) Applicant: Semtech Corporation, Camarillo, CA (US)

(72) Inventors: Jerald George Ott, III, Escondido, CA (US); Deming Li, Shenzhen (CN); Chaouki Rouaissia, Neuchâtel (CH)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 15/985,331

(22) Filed: May 21, 2018

(65) Prior Publication Data

US 2018/0375515 A1   Dec. 27, 2018

Related U.S. Application Data

(60) Provisional application No. 62/525,514, filed on Jun. 27, 2017.

(51) Int. Cl.
| | | |
|---|---|---|
| *G06F 3/045* | (2006.01) | |
| *H03K 17/955* | (2006.01) | |
| *G01B 7/02* | (2006.01) | |
| *G06F 3/044* | (2006.01) | |
| *H03K 17/96* | (2006.01) | |

(52) U.S. Cl.
CPC .......... *H03K 17/955* (2013.01); *G01B 7/023* (2013.01); *G06F 3/044* (2013.01); *H03K 17/962* (2013.01); *G06F 2203/04101* (2013.01); *H03K 2017/9606* (2013.01); *H03K 2217/96077* (2013.01); *H03K 2217/960765* (2013.01)

(58) Field of Classification Search
CPC .............. H03K 17/955; H03K 17/962; H03K 2017/9606; H03K 2217/960765; H03K 2217/96077; H03K 2017/9613; G01B 7/023; G06F 3/044; G06F 2203/04101; H04M 1/72569; H04M 1/72577; H04M 2250/12
See application file for complete search history.

(56) References Cited

U.S. PATENT DOCUMENTS

| | | | | |
|---|---|---|---|---|
| 2008/0252474 A1* | 10/2008 | Nakamura | ........... | H03K 17/955 340/657 |
| 2010/0259283 A1* | 10/2010 | Togura | ................. | H03K 17/955 324/679 |
| 2011/0043227 A1* | 2/2011 | Pance | .................... | H03K 17/98 324/681 |
| 2014/0015595 A1* | 1/2014 | Van Ausdall | ........ | H03K 17/955 327/517 |
| 2015/0370364 A1* | 12/2015 | Jordan | .................. | G06F 3/0442 345/174 |
| 2018/0157353 A1* | 6/2018 | Sleeman | ................. | G06F 3/044 |

FOREIGN PATENT DOCUMENTS

| | | | |
|---|---|---|---|
| EP | 2876407 A1 | 5/2015 | |
| EP | 2988479 A1 | 2/2016 | |

\* cited by examiner

*Primary Examiner* — Adam R. Giesy
(74) *Attorney, Agent, or Firm* — Blank Rome LLP

(57) ABSTRACT

A proximity sensor, and a portable device equipped therewith, with at least two sense electrodes, one influencing the other. By reading twice the capacity of one electrode, while either setting the potential of the counter-electrode to guard or letting it float, the sensor of the invention discriminates between a body part, or another electrically equivalent object, and low-permittivity objects.

18 Claims, 2 Drawing Sheets

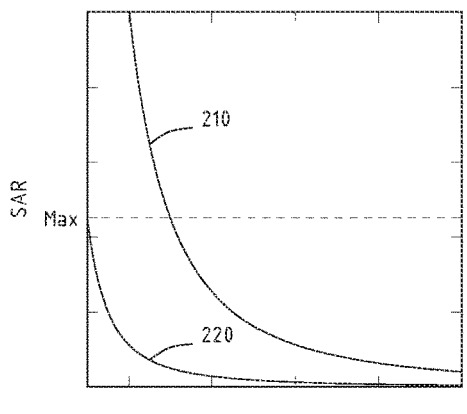
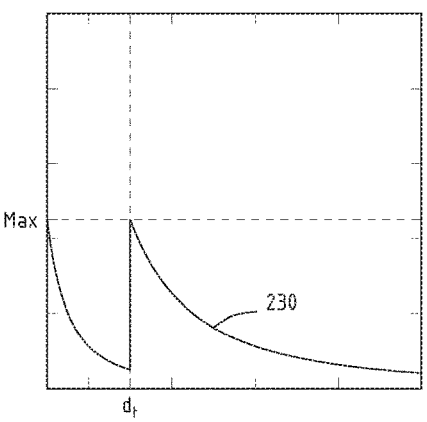
Fig. 1
Fig. 2
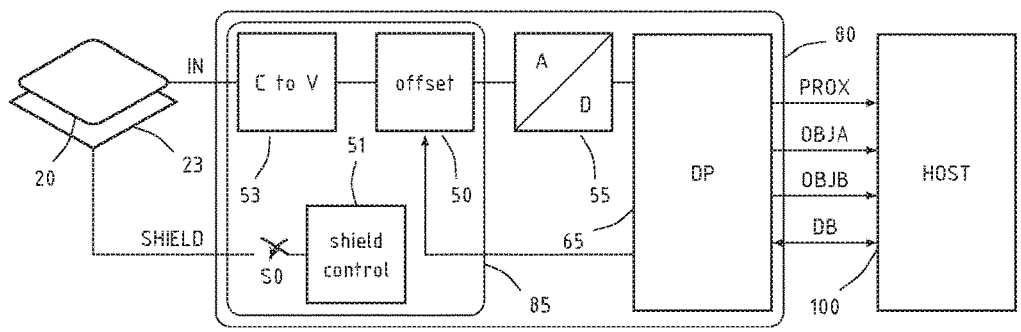
Fig. 3
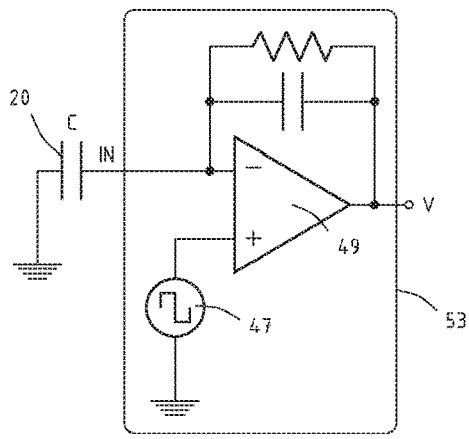
Fig. 4
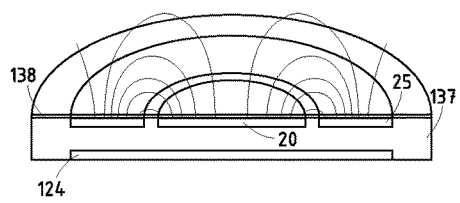
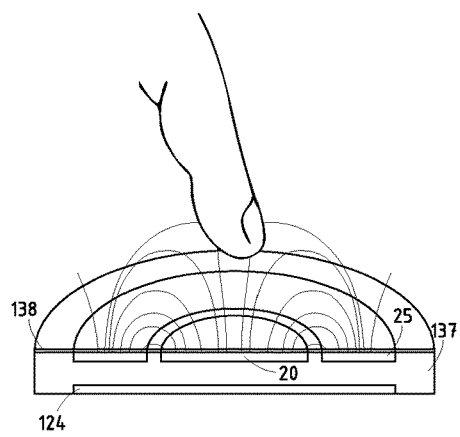
Fig. 5
Fig. 6

ADVANCED CAPACITIVE PROXIMITY SENSOR

REFERENCE DATA

The present application claims the benefit of provisional patent application U.S. 62/525,514, filed Jun. 27, 2017, the entire contents of which are hereby incorporated by reference.

FIELD OF THE INVENTION

The present invention concerns a proximity sensor and a method for detecting the proximity of a body portion. Embodiments of the present invention concern in particular portable devices like cell phones that, being equipped with the inventive proximity sensors, are capable of discriminating body parts, like for example the head or one hand of the user, from low permittivity object, and recognizing the direction whence the detected body part is approaching.

DESCRIPTION OF RELATED ART

It is often desired to detect whether a body portion is at short distance of an apparatus. In the particular case of cell phones and wirelessly connected mobile device, (including tablets and other similar terminals). This form of proximity detection can be used as an input to the apparatus, but, for RF-emitting devices, it is known to use a proximity indication to adapt the instantaneous RF power, in order to comply with SAR (Specific absorption Ratio) regulations. SAR is a measure of the amount of RF energy radiated in the human body when in close proximity to a radio emitting device (phone, tablet, laptop, etc.).

Other useful functions of portable connected devices that rely on proximity detection are: disabling the touch screen of a portable phone when it is brought to the ear for a call, lest the user may trigger unwanted actions by touching the screen with the cheek or the ear, and switching the screen backlighting off to economize energy, in the same situation.

Sensors arranged for detecting a body near to an object, including inductive, optical, heat, and capacitive based sensors, are known. In the cell phone market, the most common method today is a capacitive based sensor to detect an object near the RF antenna.

Capacitive sensors are often realized as metallized pads on a PCB but, in many cases, an existing element such as an antenna (i.e. conductive line), can double as a capacitive detector, such that the detector can be added with no surface penalty.

An example of capacitive sensor for proximity sensing in a mobile communication device is described in patent application EP2988479, in the name of the applicant, whose content is hereby included by reference.

Despite all the above advantages, conventional capacitive detectors alone provide little or no information about the distance and size of the approaching object. A body part at a given distance and an inanimate object, if it is large and close enough, can generate the same capacity rise, and would not be distinguishable.

This lack of discrimination of capacitive detectors may lead to wrong decisions in some situations. One example is when the phone or the portable device is placed on a support, like a table or a holder. In this case the phone may reduce RF power or disable the screen without actually needing to. Mitigating these false detections in conventional capacitive sensors is difficult.

BRIEF SUMMARY OF THE INVENTION

An aim of the present invention is to provide an advanced capacitive detector which may address the shortcomings of the conventional devices mentioned above, as set forth in the appended claims.

Although the invention is applicable to a large array of devices, for example laptops, tablets, e-readers, wearables, hearables, electronic measuring instruments, and also to non-portable devices, the present description will refer simply to a "mobile phone" for concision's sake. This should not be taken as a limiting feature of the invention though.

BRIEF DESCRIPTION OF THE DRAWINGS

The invention will be better understood with the aid of the description of an embodiment given by way of example and illustrated by the figures, in which:

FIGS. 1 and 2 plot the SAR levels from a portable connected device;

FIG. 3 illustrates schematically a capacitive proximity sensor in a portable connected device;

FIG. 4 is a simplified idealized circuit for converting capacity to voltage.

FIGS. 5 and 6 illustrate the capacity variations of a capacitive proximity detector.

DETAILED DESCRIPTION OF POSSIBLE EMBODIMENTS OF THE INVENTION

Figure 7:
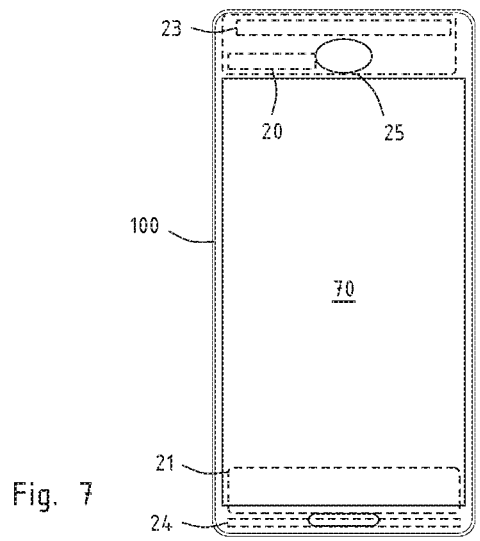
FIG. 7 shows a portable connected device including a capacitive sensor according to one aspect of the invention.

FIG. 1 shows the relationship between the SAR as a function of the distance between the transmitter antenna and the user's body. Curve 210 may represent the Specific Absorption Rate associated with a conventional cellphone transmitting at full RF power. It is apparent that the absorption rate exceeds the statutory absorption rate limit (Max) for small distances.

Curve 220 represents the absorption rate in a phone associated with a phone whose RF power has been deliberately reduced. Clearly the rate complies with statutory limits but, since the power is lower, the connectivity of the phone will be degraded.

FIG. 2 illustrates a solution to the above dilemma. The connected device is equipped with a proximity detector that measures the distance d to the user. A hardware or software processor in the device generates a logical signal when the distance sinks below a predetermined limit $d_t$ that triggers a momentary reduction of the RF power, as shown by plot 230. In this manner the device suffers no degradation of the connectivity when the distance d is large enough that the SAR is below the maximum acceptable limit, and the power is reduced only when it is required. Although FIG. 2 shows only one threshold $d_t$, it should be understood that the device could determine the distance in relation to several threshold values, and reduce the power in several progressive steps, in a search of the best connectivity compatible with the SAR limit at any given distance.

FIG. 1 shows schematically the structure of a capacity proximity detector, as it could be employed in the frame of the invention. The detector includes a sense electrode 20 connected to an input terminal IN for the determination of its capacity. The capacity of the electrode can be determined by applying a variable potential of determined amplitude V to the input terminal IN, integrating the input current to obtain the electric charge Q, which is related to the capacity by C=Q/V. The input potential can vary according a sinusoidal or square law, for example.

The capacitive sensor readout circuit 80 may include a capacity-to-voltage conversion unit 53, that generate a voltage signal proportional to the capacity seen by the electrode 20.

FIG. 4 shows a simplified circuit that could be used for the purpose. The informed reader will recognize that the terminal IN is a low impedance node whose potential is the same, thanks to reaction, as the output of the voltage source 47, which can be square, sinusoidal, or follow any suitable function, and that the amplitude of the output signal V is proportional to the capacity 20. For additional information, the reader is directed to patent application EP2876407, which is hereby incorporated by reference. Other circuits fulfilling the same function as the one of FIG. 4 are available and comprised in the frame of the invention. The principle of operation of the capacitive sensor readout circuit 80 is that, the head and body of a user have a dielectric constant much higher than that of free space. Thus, when the user approaches the head or another body to the electrode, 20 its capacity increases by a tiny but measurable amount.

FIGS. 5 and 6 illustrate schematically the capacitive effect that lies behind the proximity sensor of the invention. In FIG. 5, the capacitive sensor is represented by a disk pad 20 on a printed circuit board 137, surrounded by a ground ring 25. The electrode 20 is preferably backed by a protective electrode 124 held at ground potential or at shield potential, to screen out noise coming from the circuit of the phone that lies below. Preferably, the conductive pads 20, 25 are covered by a thin dielectric protective layer 138. When the electrode 20 is connected to the IN terminal of the capacitive detector, its electric potential is different from that of the surrounding ground electrode, and an electric field, represented by the field lines, is generated.

When body part approaches, as in FIG. 6, it modifies the electric field, because it has a dielectric constant ε different from that of the surrounding air, and possibly also because of its electric conductivity. This records as a small change of the capacity C seen by the electrode 20.

Importantly, the shape of the sense electrode 20 has little significance and the capacitive sensor would function as well with an electrode of arbitrary shape. The ground ring 25 and the shield 124, although useful, are not essential, and the real shape of the electric field will in any case be very different from that represented, because the electrode will couple in complicated ways with all the components of the phone. In all cases, no matter what the final configuration will be, the capacity C of the electrode 20 will have a baseline value Cenv, constant or slowly varying together with the environmental characteristics like the temperature, that will increase slightly and momentarily by an amount CUser with the approach of a body part. Although the exact amount of the increase may be difficult to compute a priori exactly, it can be estimated by the formula below $$C_{user} = \varepsilon_0 \varepsilon_r A/d$$

where A is the common area between the two electrodes, hence the common area between the user's finger/palm/face and the sensor electrode 20, d their distance, and $\varepsilon_0$, $\varepsilon_r$ denote the absolute and relative dielectric permittivity. Conductive effects are neglected.

The relative permittivity of the human body is very high, due to its high water content, and is typically $\varepsilon_r$>80. The permittivity of most structural insulating materials, such as glass, FR4, plastic laminates and wood, between 2 and 8. Thus the capacitive detector of the invention will be considerably more sensitive to the human body than to other materials, but could still be misinterpret a large body of low permittivity as a part of human body if it is very close and fairy large.

Returning to FIG. 3, we have seen that the capacity change determined by the proximity of the user is superposed to a large baseline value that is constant, or drifts slowly. The sensor of the invention includes preferably an offset subtraction unit 50 that is arranged to subtract a programmable value to the total capacity before it is converted to a digital value in the ADC 55, to enhance the proximity induced variations and utilize optimally the dynamic range of the latter.

In the drawing, the offset compensation unit 50 is represented as a separate block acting on an analog signal generated by the capacity-to-voltage converter 53. Although this is a possible and favored implementation, it is not the only one; the invention is not limited to this embodiment, and the blocs of the schematics 1 should be interpreted as functional elements rather than physically separated entities. In variants, the subtraction of the offset could be carried out in the capacity-to-voltage converter 53, or in the ADC 55. Also, if the proximity detector readout circuit 80 comprises several input channels, as it will be detailed further, the offset compensation could be done in independent units for each channel, or in a shared compensation circuit.

Another difficulty in capacitive proximity detectors is that the input electrode 20 can pick up all sort of signal and disturbances generated in its environment, including those coming from the phone in which it is embedded. Although such disturbances can be filtered by signal processing, it is preferable to attenuate them from the start. To this purpose, the detector can provide a shield electrode 23, below the sense electrode 20, in order to screen it from the electronics inside the phone. Preferably, the sense electrode is connected to the output terminal, of a shield control unit 51, which follows the variable potential of the input terminal IN. In this manner, the shield 23 does not contribute to the capacity seen by the electrode 20. The shield electrode is represented below the sense electrode, but it could be positioned elsewhere.

Digital processor 65 elaborates the digital signal generated by the ADC 55 and provides a proximity signal PROX based on the capacity of the electrode 20. It is in communication with a host system, for example a mobile phone through a bus DB, and can be implemented by any form of wired or programmable logic. The digital processor 65 takes care of function like fine offset subtraction, noise filtering, and implements a decision algorithm that asserts the PROX signal when the capacitance read at the input $IN_1$ (as well as input $IN_2$) is compatible with a given threshold. The digital processing will then produce another set of signals named $OBJECT_A$ and $OBJECT_B$ that are asserted, for example whether the capacitance increase is judged to be a body part (head cheek, hand, lap) or an inanimate object. These are what the host can then use to determine if power should be lowered from the part of a user's body in proximity.

Although FIG. 3 represents only one antenna terminal, the proximity sensor could have several input groups $IN_A$, $IN_B$, ..., each connected to different electrodes for different antenna terminals, possibly sharing a common ADC by a multiplexer.

Importantly, the capacitive sensor is capable of disconnecting the shield electrode (or at least one of the shield electrodes if there are many), leaving the corresponding shield input in a high-impedance state. In such a situation, the corresponding sense electrode will be floating.

Although figure represents the function of disconnecting the shield electrode by a switch S0, there are other ways to realize a terminal that can be set either to a desired voltage or to a high-impedance state, for example a logic three-state output (if the variable voltage 47 is a square signal), a transmission gate, or a CMOS switch, among others.

FIG. 7 shows a possible realization of the sensor of the invention in a mobile phone 100 that has, concealed below a front dielectric layer, a sense electrode 20 connected to an input IN of the proximity detector, a shield electrode 23 connected to the SHIELD terminal, and, optionally, a ground guard pad 25 encircling the sense electrode 20 and the shield electrode 23.

Figure 8:
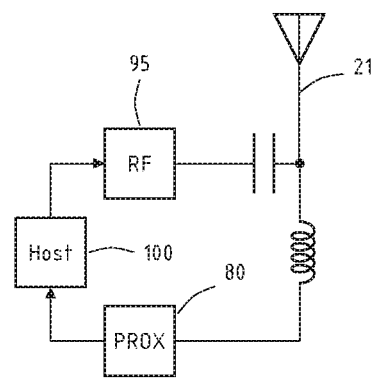
FIG. 8 shows a possible connection in which a RF antenna doubles as capacitive sensor.
Figure 9:
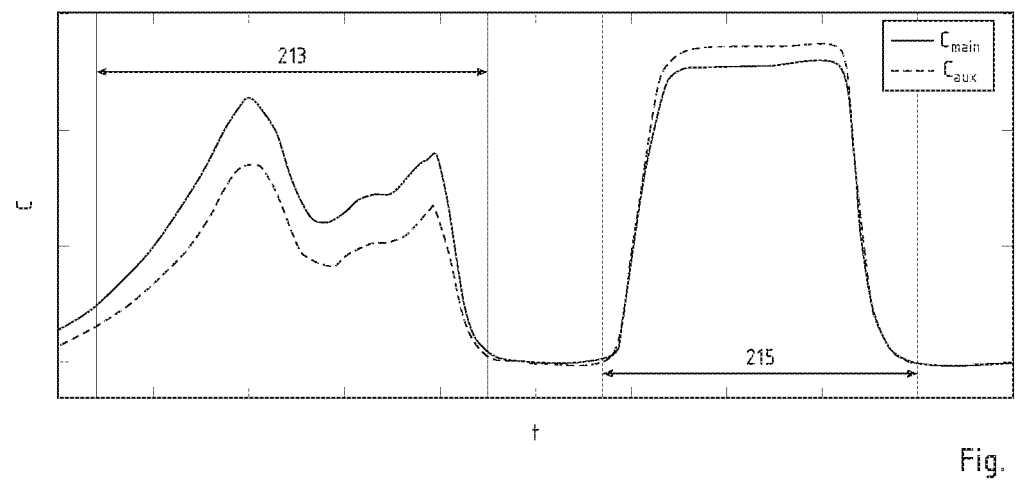
FIG. 9 plots the capacity read by the sensor of the invention when the portable device in which it is included approaches first a part of a human body, and then an inanimate object.

Preferably the mobile phone comprises more than one pair of electrodes. In the example shown in FIG. 7, the sense electrode 20 and the shield electrode 23 are placed close to the top of the phone, and another pair comprising a sense electrode 21 and a shield electrode 24 is placed at the bottom of the phone 100. Possibly, the bottom sense electrode 21 is connected to both the capacitive proximity sensor 80 and to a RF transceiver through suitable decoupling elements, as shown in FIG. 8, and doubles as RF antenna.

As it can be appreciated, the shield electrodes 23 and 24 needs not be below the corresponding electrodes 20 and 21, but could also be aside, as depicted, or partly covered, facing the front or the back of the phone, or in any position on the phone 100.

The proximity detector of the invention is arranged to acquire two capacity measurements: the first one, denoted as Cmain is the capacity seen by the main sense electrode 20 while the auxiliary shield electrode 23 is held by the shield control unit at the same potential as the sense electrode 20, and the second, denoted as Caux is the capacity seen by the sense electrode 20 while the shield electrode 23 is floating (the SHIELD output in a high-impedance state. Should the telephone include more than one sense/shield electrode pair, the same sequence can be repeated in each pair, for example the capacity of the lower sense electrode 21 will be measured first holding the shield electrode 24 at the same potential as the electrode whose capacity is measured, and then when the shield electrode 24 is floating.

The inventors have found that setting the auxiliary electrode 23 in a high-Z state changes the measured capacity in a manner that allow to discriminate between a body part and a low-permittivity object. FIG. 8 plots the capacities Cmain (solid) and Caux (dashed) against time. The left part of the plot (interval 213) corresponding to the approach of the user's hand, and the right part of the plot (interval 215) corresponding to the approach of a low-permittivity object. It can be seen that, although the signals have similar amplitudes, Cmain and Caux reacts differently to the approach of the two objects. In this configuration, Cmain responds more to the body part than to the low-permittivity object, and inversely Caux. Advantageously, the digital processor 65 is arranged to determine whether the approaching object is a part of a human body rather than a low-permittivity object, based on the capacities Cmain and Caux.

This can be achieved by choosing a strategy that includes essentially all the genuine approaches and reject at least a large part of the low-permittivity bodies. For example, the $OBJECT_A$ or the $OBJECT_B$ signal could be asserted when the first capacity and the second capacity, taken as coordinates in a two-dimensional plane, locate a point inside a predefined acceptance region, or when the ratio Cmain/Caux in a predetermined acceptance interval, or by another suitable selection algorithm based on Cmain and Caux.

REFERENCE SIGNS 20 sense electrode
21 sense electrode
23 shield, auxiliary electrode
24 shield, auxiliary electrode
25 guard electrode
47 voltage source
50 offset compensation
51 shield control
53 capacity to voltage converter
55 ADC
65 digital processor
70 display
80 capacitive sensor circuit
85 analog interface
95 RF transceiver
100 host system, mobile phone, portable device
124 back electrode
137 printed circuit
138 overlay
210 Specific Absorption Rate/full RF
213 approach of user's body
215 approach of low-permittivity object
220 Specific Absorption Rate/reduced RF
230 Specific Absorption Rate/smart

The invention claimed is:

1. A proximity sensor for a portable device, the sensor being arranged for detecting proximity of a body portion to the portable device, and for rejecting inanimate objects, comprising: one main electrode facing the outside of the portable device and held to a potential of a variable voltage source; one auxiliary reference electrode; a readout circuit operatively arranged for acquiring a first measurement of a capacitance of the main electrode by applying a same potential to the main electrode and to the auxiliary reference electrode, and for acquiring a second measurement of the capacitance of the main electrode while keeping the auxiliary reference electrode floating; and a decision unit arranged to generate a proximity signal and determine whether the approaching object is a part of the human body based on said first measurement of the capacitance and second measurement of the capacitance.

2. The proximity sensor of claim 1, wherein said inanimate objects have a dielectric permittivity substantially lower than a dielectric permittivity of the human body, wherein the decision unit is configured for accepting approaching objects as parts of a human body when the first measurement of the capacitance exceeds the second measurement of the capacitance, and for rejecting approaching objects as inanimate objects when the second measurement of the capacitance exceeds the first measurement of the capacitance.

3. The proximity sensor of claim 1, wherein said main electrode is a conductive pad, and said auxiliary reference electrode is a conductive element placed aside the main electrode.

4. The proximity sensor of claim 1, comprising a shielding electrode below the main electrode, the readout circuit being arranged to keep the shielding electrode at the electric potential of the auxiliary reference electrode.

5. The proximity sensor of claim 1, wherein the decision unit is operatively arranged to generate a proximity signal when the first measurement of the capacitance and the second measurement of the capacitance, taken as coordinates in a two-dimensional plane, locate a point inside a predefined acceptance region.

6. The proximity sensor of claim 1, wherein the decision unit is operatively arranged to generate a proximity signal when a ratio between the first measurement of the capacitance and the second measurement of the capacitance, lies in a predetermined interval.

7. The proximity sensor of claim 1, comprising a charge to voltage converter, arranged for generating a voltage level proportional to said first measurement of the capacitance and/or second measurement of the capacitance, an offset subtraction unit operatively arranged to subtract a first programmable offset level from said voltage level, an analog to digital converter, and a digital processor programmed to generate a proximity signal based on said first measurement of the capacitance and said second measurement of the capacitance decision unit.

8. The proximity sensor of claim 1, wherein the first measurement of a capacitance and the second measurement of a capacitance are measured one after the other in multiplexed fashion.

9. The proximity sensor of claim 1, comprising subtracting a first programmable zero value from the first measurement of a capacitance and a second programmable zero value from the second measurement of a capacitance.

10. A method of determining proximity between a sensor and a body part comprising: obtaining a first measurement of a capacitance of a main electrode facing a detection volume and held to a potential of a variable voltage source; obtaining a second measurement of the capacitance of the main electrode, whereby the first measurement of the capacitance is measured while applying a same potential to the main electrode and to an auxiliary electrode, and the second measurement of the capacitance is measured while keeping the auxiliary electrode floating; generating a proximity signal; accepting approaching objects as parts of a human body when the first measurement of the capacitance exceeds the second measurement of the capacitance, and rejecting approaching objects as inanimate objects having a dielectric permittivity substantially lower than a dielectric permittivity of the human body when the second measurement of the capacitance exceeds the first measurement of the capacitance.

11. The method of claim 10, wherein the first measurement of the capacitance and the second measurement of the capacitance are measured one after the other in multiplexed fashion.

12. The method of claim 10, comprising subtracting a first programmable zero value from the first measurement of the capacitance and a second programmable zero value from the second measurement of the capacitance.

13. The method of claim 10, wherein the proximity signal is generated if the first measurement of the capacitance and second measurement of the capacitance, taken as coordinates in a two dimensional plane, locate a point in a determined region.

14. The method of claim 10, wherein the proximity signal is generated if a ratio between the first measurement of the capacitance and the second measurement of the capacitance, lies in a predetermined interval.

15. A portable device including a proximity sensor arranged for detecting proximity of a body portion to the portable device, and for rejecting water or contaminants, comprising: one main electrode facing the outside of the portable device and held to a potential of a variable voltage source; one auxiliary electrode; a readout circuit operatively arranged for acquiring a first measurement of the capacitance of the main electrode by applying a same potential to the main electrode and to the auxiliary electrode, and for acquiring a second measurement of the capacitance of the main electrode while keeping the auxiliary electrode floating, and a decision unit arranged to generate a proximity signal based on said first capacity and second capacity; and accepting approaching objects as parts of a human body when the first measurement of the capacitance exceeds the second measurement of the capacitance, and rejecting approaching objects as inanimate objects having a dielectric permittivity substantially lower than a dielectric permittivity of the human body when the second measurement of the capacitance exceeds the first measurement of the capacitance.

16. The portable device of claim 15, being arranged to reduce a level of radio emission or a screen brightness, or disabling a tactile input device based on said proximity signal, when the approaching object is a part of the human body.

17. The portable device of claim 15, being a mobile cellular phone, a wireless hand phone, a tablet, or a laptop.

18. The portable device of claim 15, wherein the proximity sensor comprises a plurality of pairs of electrodes, each pair having a main electrode and an auxiliary electrode, the readout circuit being operatively arranged for acquiring a first measurement of a capacitance of a main electrodes by applying a same potential to the main electrode and to the corresponding auxiliary electrode, and for acquiring a second measurement of the capacitance of any of the main electrodes while keeping the corresponding auxiliary electrode floating.

* * * * *